(12) United States Patent
Ganesan et al.

(10) Patent No.: US 7,111,273 B1
(45) Date of Patent: Sep. 19, 2006

(54) SOFTPAL IMPLEMENTATION AND MAPPING TECHNOLOGY FOR FPGAS WITH DEDICATED RESOURCES

(75) Inventors: Satish R. Ganesan, Mountain View, CA (US); Sundararajarao Mohan, Sunnyvale, CA (US); Ralph D. Wittig, Menlo Park, CA (US)

(73) Assignee: Xilinx, Inc., San Jose, CA (US)

( * ) Notice: Subject to any disclaimer, the term of this patent is extended or adjusted under 35 U.S.C. 154(b) by 193 days.

(21) Appl. No.: 10/613,904

(22) Filed: Jul. 3, 2003

(51) Int. Cl.
*G06F 17/50* (2006.01)
(52) U.S. Cl. ............................. 716/17; 326/39; 326/40; 326/41; 716/16
(58) Field of Classification Search ............ 716/16–18; 326/39–41
See application file for complete search history.

(56) References Cited

U.S. PATENT DOCUMENTS

| | | | |
|---|---|---|---|
| 5,151,623 A * | 9/1992 | Agrawal | 326/40 |
| 5,610,829 A * | 3/1997 | Trimberger | 716/16 |
| 6,118,300 A * | 9/2000 | Wittig et al. | 326/41 |
| 6,150,838 A * | 11/2000 | Wittig et al. | 326/39 |
| 6,184,713 B1 * | 2/2001 | Agrawal et al. | 326/41 |
| 6,336,208 B1 | 1/2002 | Mohan et al. | |
| 6,348,813 B1 * | 2/2002 | Agrawal et al. | 326/41 |
| 6,546,539 B1 * | 4/2003 | Lu et al. | 716/12 |
| 6,603,332 B1 * | 8/2003 | Kaviani et al. | 326/39 |
| 2002/0079921 A1 * | 6/2002 | Kaviani et al. | 326/40 |

* cited by examiner

*Primary Examiner*—Thuan Do
*Assistant Examiner*—Naum Levin
(74) *Attorney, Agent, or Firm*—Edel M. Young; Ed Mao; John J. King (57) ABSTRACT

A softPAL implementation and mapping method are described. The implementation utilizes both LUTs and architecture-specific logic circuits to implement softPAL functions, and selects from several implementations in order to decrease delay in function implementation. The method describes techniques for estimating p-terms in a 2-bounded sub-graph, factoring methods, mapping strategies for LUTs and dedicated logic elements, and delay optimization of critical paths.

43 Claims, 8 Drawing Sheets

SOFTPAL IMPLEMENTATION AND MAPPING TECHNOLOGY FOR FPGAS WITH DEDICATED RESOURCES

FIELD OF THE INVENTION

The present invention relates to mapping combinational logic to circuit elements of a programmable logic device, and more particularly to a system and method for implementing and mapping a function to a heterogeneous mixture of look-up tables (LUTs) and other architecture-specific logic circuits.

BACKGROUND OF THE INVENTION

Some types of programmable logic devices (PLDS) (e.g. FPGAs) are implemented with a combination of configurable logic blocks (CLBs) that include lookup tables (LUTs) capable of implementing any function of their input signals, flip-flops for storing data, and dedicated resources such as fast carry chains and cascade structures capable of implementing a limited number of functions. These elements within a CLB can be interconnected to form more complex functions without having to use general routing resources, causing these complex functions to be implemented with less delay. Also, within a CLB, delay is predictable, since there is no unknown routing delay.

Mapping software selects the kinds of resources in the FPGA (or other PLD) that will implement each portion of a user's logic design, and typically attempts to optimize area, delay, or a combination of area and delay when choosing the types of resources. For an FPGA implementation, some conventional mapping software implements combinational logic portions of a user's logic design in a combination of LUTs and dedicated resources, but doesn't take full advantage of the dedicated resources. For example, mapping software may use dedicated fast carry chains to implement the carry portion of an arithmetic function but may not use fast carry chains to implement additional logic functions such as AND, OR, or MUX that these fast carry chains can also implement. In particular, conventional mapping software does not map common sum-of-products (SOP) functions to architectural features such as a combination of fast carry chains, cascade structures, and LUTs that can efficiently implement SOP functions.

Examples of conventional mapping software include Chortle-crf and FlowMap. The Chortle software is described in "Chortle-crf: Fast Technology Mapping for Lookup Table-Based FPGAs" by Robert Francis, Jonathan Rose, and Zvonko Vranesic, proceedings of the Design Automation Conference 1991, pp 227–233. The FlowMap software is described in "FlowMap: An Optimal Technology Mapping Algorithm for Delay Optimization in Lookup-Table Based FPGA Designs" by J. Cong and Y. Ding, IEEE Transactions on CAD, February 1994, vol. 13, No. 1, pp 1–12. Flowmap must map to LUTs of a single size, but given a LUT size, Flowmap can map any given circuit into a network of LUTs.

Mapping software may model area as the total number of LUTs or CLBs required for the mapping, and typically models delay in terms of the number of levels of logic in the path from an input of the design to an output of the design that is determined to be the critical (slowest) path. Chortle-crf attempts to produce a mapping having optimized delay and area, and FlowMap attempts to produce a mapping having optimized delay. Other mapping software focuses on other features of the PLDs to which designs are to be mapped. One such algorithm for multiple sized LUTs is described in a paper by Jianshe He and Jonathan Rose entitled "Technology Mapping for Heterogeneous FPGAs" (1994 ACM International Conference on FPGAs). Another mapping software package described by Jason Cong and Songjie Xu for mapping a design to multiple sizes of LUTs entitled "Delay-Optimal Technology Mapping for FPGAs with Heterogeneous LUTs," presented at the 1998 Design Automation Conference improves upon the process by He and Rose. Another process for mapping to a plurality of sizes of LUTS is described by Mohan and Chaudhary in U.S. Pat. No. 6,336,208 B1, entitled "Delay Optimized Mapping For Programmable Gate Arrays With Multiple Sized Lookup Tables."

Conventional methods of mapping don't make full use of the dedicated resources available on a particular architecture. A method that expands mapping considerations to the other dedicated resources in addition to LUTs, as well as addressing other related problems, is therefore desirable.

SUMMARY

Accordingly, a mapping method is described that can map to heterogeneous elements including LUTs of multiple sizes and dedicated resources. In many cases, mapping to additional dedicated resources will lessen the delay compared to mapping solely to LUTs. In particular, sum-of-products functions are mapped to a combination of LUTs and dedicated resources. Sum-of-products functions that are too wide to be implemented by a single LUT but can be implemented by dedicated resources in combination with LUTs are called softPALs. To implement a softPAL using a combination of LUTs and dedicated resources, several possibilities for implementing the softPAL are investigated for implementation and associated delays. The junction between variables (e.g. the logical AND junction between variables a and b in the expression "F=a*b*") is called a node. In a 2-bounded (2-input) sub-graph of function F, two signals (variables a and b) flow into the node, the operation (a logical AND) is performed at the node, and one signal (the value of function F) flows out of the node. When a node is covered by a softPAL (a softPAL is a configuration used when the function at the node is wider than a LUT can handle and must be implemented by a combination of LUTs and other dedicated resources), the node is translated into sum-of-products (SOP) form, and the method of the present invention is applied. In one embodiment, a method of function factoring and best-delay implementation is used to format a function for mapping to a combination of LUTs and dedicated resources.

The method proceeds in two phases. In a first phase, the function F expressed in SOP form is decomposed (factored) into chains of factored cube sets (FCS). An FCS is a sub-expression of the original function F having the form F(i)=<shared set>*<unshared set>, where the shared set is a logical AND function of any number of variables, and the unshared set is a logical OR function of K or fewer logically ANDed variables, where K is the number of LUT inputs. For example, in the SOP expression "F=a*b*c*d*e+!a*b*c*e*!f+a*b*c*!d*e", a FCS has a shared set of "b*c*e*"

and an unshared set of

"a*d+!a*!f+a*!d".

In the above expressions, a logical OR operation is denoted by a "+" symbol, a logical AND operation is denoted by a "*" symbol, and a logical NOT operation is denoted by a "!" symbol.

In a second phase, each FCS is implemented according to several schemes and the scheme with the least delay is selected. In one embodiment that can be implemented in the Virtex-II or Virtex-II Pro architectures available from Xilinx, Inc., there are three schemes. A first scheme implements unshared functions in LUTS, combines them using vertical carry chains implemented as AND gates, and finally sums them using the cascade OR gates of the Virtex-II architecture. A second scheme uses the LUTs as AND gates, the vertical carry chains as AND gates, and the horizontal cascade chains as OR gates. A third scheme implements the entire function in LUTS. Delays of the three schemes are compared and the fastest chosen. In other embodiments, additional schemes may be used, for example a scheme that uses LUTs as OR gates, vertical carry chains as a mixture of AND and OR gates, and horizontal cascade chains as OR gates. Yet another scheme implements some carry chains as AND gates and other carry chains as OR gates. If the architecture has other features, other schemes will be developed accordingly to take advantage of the features available in the architecture.

In a further aspect of the invention, the critical path of the function is determined, and additional attempts are made to reduce delay on the critical path.

The present invention will be more fully understood in view of the following description and drawings.

BRIEF DESCRIPTION OF THE DRAWINGS

Similar elements in different figures are labeled similarly.

DETAILED DESCRIPTION

The present invention is applicable to a variety of programmable logic devices (PLDs) having both LUTs and dedicated resources capable of implementing softPALs. A softPAL is a complex function that when written in a sum-of-products (SOP) form is too wide to be implemented in a single LUT but can be implemented using a combination of these LUTs and other special structures. The special structures include dedicated logic elements, for example, carry multiplexers, and carry/cascade elements. These architecture-specific hardware elements can perform a restricted set of functions including the AND function and the OR function (similar to Programmable Array Logic (PAL), thus they can be combined with LUTs to implement sum-of-products functions including softPALs). Current PLDs, such as the Virtex II™ FPGA from Xilinx, Inc., have dedicated logic elements located within a configurable logic block (CLB), and provide a way to implement logic without using general purpose routing resources. Using these dedicated logic elements to implement a function may significantly improve design performance, because delays within a CLB are both predictable and small, and do not include any unknown routing delays.

The present invention describes a method of implementing softPALs in a target architecture using a combination of LUTs and dedicated resources to reduce delay. While the embodiments below refer to a Virtex II™ FPGA including simple 4-LUTs as well as horizontal and vertical (carry and cascade) logic expansion chains, one skilled in the art may use the principles of the present invention to obtain similar mappings on other architectures.

One softPAL is simply a sum-of-products (SOP) representation of a particular equation. An SOP representation is a logical OR of product terms covering the equation, where product terms are a logical AND of a set of variables (input signals). In the following expressions, a logical OR operation is denoted by a "+" symbol, a logical AND operation is denoted by a "*" symbol, and a logical NOT operation is denoted by a "!" symbol. For example, for the SOP expression "F=a*b*c*d*e+!a*b*c*e*!f+a*b*c*!d*g", the first product term (P-term0) is a*b*c*d*e, the second product term (P-term1) is !a*b*c*e*!f, the third product term (P-term2) is a*b*c*!d*g, and product terms P-term0, P-term1, and P-term2 are logically OR'ed together. Thus, the function F above has three P-terms and seven inputs.

The SOP function is implemented in the PLD by choosing from the elements (i.e. LUTs and special structures) available in the target architecture and defining the couplings between those chosen elements. The resultant softPAL implementation is described in terms of the number of P-terms and inputs of the SOP form of the function implemented. Specifically, in the above example, the softPAL is a 7 input, 3 P-term softPAL.

The available hardware elements for implementing the softPAL are listed in a cost table, along with their associated delays. The delays of many elements are not known before implementation, because those delays vary based on both the function to be implemented and the final method of implementation. However, element delays are needed to determine best-case labeling during the conventional mapping process. Thus, when delay information is not available, element delays are estimated for initial analysis and later corrected in the cost table. The softPAL implementations in the cost table are listed in order of increasing delay, which relates to both increasing number of P-terms and increasing number of inputs. For example, a 6 input, 4 P-term softPAL is listed earlier in the cost table than a 10 input, 6 P-term softPAL.

Figure 1A:
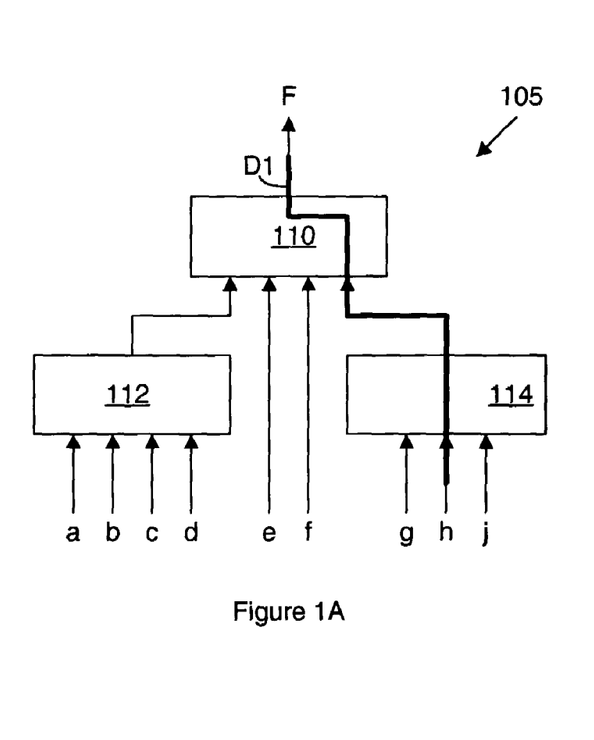
FIG. 1A is a block diagram of mapping an equation to LUTs alone.

As noted above, conventional methods map functions like softPAL equations only to LUTs. Mapping only to LUTs produces an overall delay corresponding to the number of levels of LUTS in the implementation multiplied by the LUT delay. For example, FIG. 1A is a block diagram of a mapping 105 of the equation "F=a*b*c*d*e*f*g*h*j"

to LUTs alone. Variables a, b, c, and d are applied to a first LUT 112 and variables g, h, and j are applied to a second LUT 114. An output terminal of each of LUTs 112 and 114 is coupled to an input terminal of a third LUT 110. Additionally, variables e and f are applied to input terminals of third LUT 110. The function F is provided at an output terminal of third LUT 110. Assuming all input variables arrive at the same time, an overall delay D1 of mapping 105 is the delay of LUT 114 plus the delay of LUT 110, or two times the delay of a single LUT.

Figure 1B:
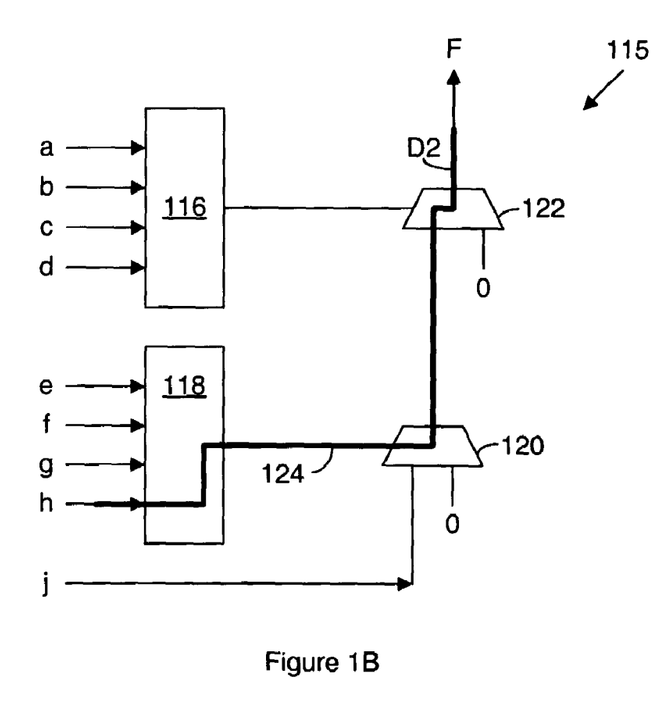
FIG. 1B is a block diagram of a mapping of a softPAL equation to a combination of LUTs and dedicated resources in accordance with one embodiment of the present invention.

FIG. 1B is a block diagram of a mapping 115 of the same softPAL equation

"F=a*b*c*d*e*f*g*h*j"

to a combination of LUTs and architecture-specific logic circuits in accordance with one embodiment of the present invention. Variables a, b, c, and d are applied to a first LUT 116 and variables e, f, g, and h are applied to a second LUT 118. Variable j is applied to a first multiplexer 120, first multiplexer 120 having another input terminal coupled to receive a logic "0" value. A control terminal of first multiplexer 120 is coupled to receive an output of second LUT 118 on line 124. A second multiplexer 122 is coupled to receive an output of first multiplexer 120 and a logic "0" value. A control terminal of second multiplexer 122 is coupled to receive an output value from first LUT 116. The function F is provided at an output terminal of second multiplexer 122.

In contrast to FIG. 1A, mapping the function as a softPAL to both LUTs and carry multiplexers as in FIG. 1B produces an overall delay D2 corresponding to one level of LUTs (LUT 116 or 118) plus twice the total carry delay (for multiplexers 120 and 122) plus the carry overhead delay. The carry overhead delay is the delay caused by the lines between these elements.

Therefore, if twice the total carry delay plus the carry overhead delay is less than the delay of a single LUT, then this mapping 115 to both LUTs and architecture specific resources provides a superior implementation as compared to mapping 105 solely to LUTs (FIG. 1A).

A softPAL cost table is a table of the various elements available for mapping the softPAL (e.g. a LUT or a dedicated resource or a combination) and the associated delay for each element. As mentioned above, the softPALs in the cost table are listed in order of increasing number of P-terms and increasing number of inputs. Conventionally, the first element in a cost table that satisfies the delay requirement of a logic function is chosen for mapping. However, a smaller delay may be obtained using another element listed later in the cost table. Therefore, an embodiment of the present invention includes a post-labeling optimization scheme that investigates multiple elements in a cost table meeting the delay requirements for the purpose of optimizing the overall delay along the critical path of the implementation.

The embodiments described below are softPAL factoring and best-delay implementation schemes for PLDs with carry and horizontal cascade elements, such as the Virtex II™ FPGA. However, the principles described may be applied to other target architectures by one skilled in the art.

The function is formatted several ways for mapping to several combinations of LUTs and dedicated resources.

Figure 2:
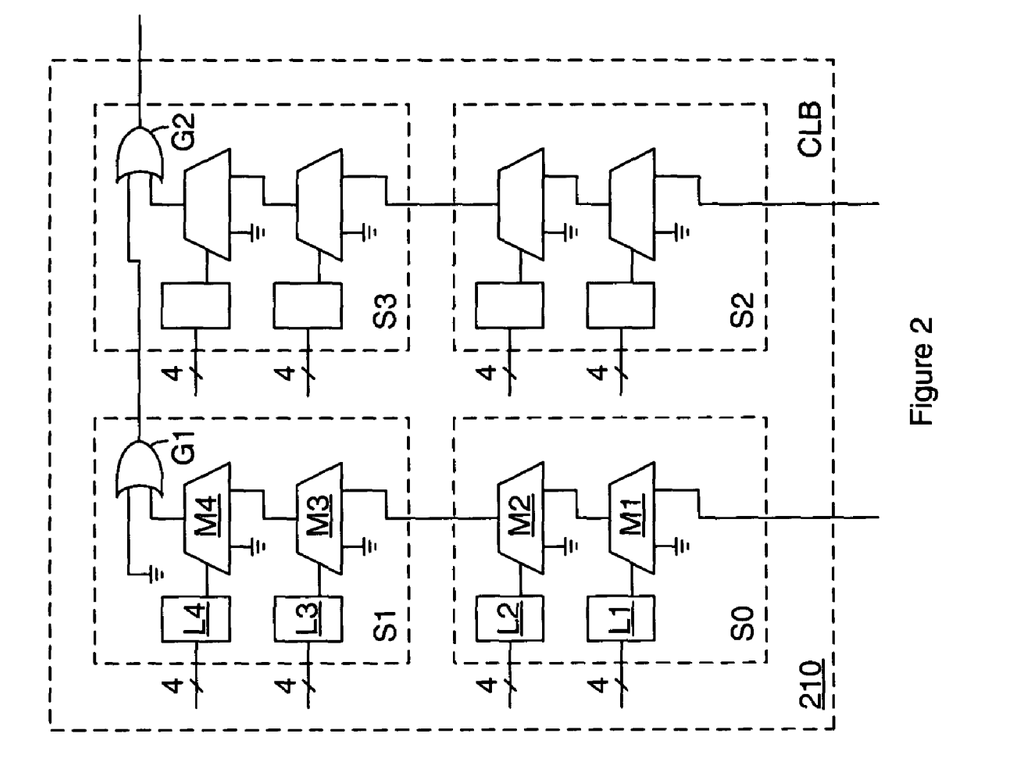
FIG. 2 is a block diagram of a configurable logic block of a PLD with LUTs, carry, and cascade elements available for implementing a softPAL function in accordance with one embodiment of the present invention.

FIG. 2 is a block diagram of a configurable logic block (CLB) of a chip (e.g. a Virtex II™ FPGA) implementing a function using vertical carry and horizontal cascade elements in accordance with one embodiment of the present invention. CLB 210 includes four slices S0, S1, S2, and S3. Each slice includes two LUTs and two multiplexers. For example, slice S0 includes LUTs L1 and L2 and multiplexers M1 and M2, and slice S1 includes LUTs L3 and L4 and multiplexers M3 and M4. An output terminal of multiplexer M1 is coupled to an input terminal of multiplexer M2, and an output terminal of multiplexer M3 is coupled to an input terminal of multiplexer M4. Slice S0 is vertically coupled to Slice S1 by connecting an output terminal of multiplexer M2 to an input terminal of multiplexer M3. Slice S1 additionally includes OR gate G1. Slices S2 and S3 include similar elements to slices S0 and S1, respectively. OR gate G1 is horizontally coupled to OR gate G2 in slice S3 of CLB 210. Vertically stringing together factored cube set (FCS) chains is accomplished using the carry elements (e.g., multiplexers M1–M4). Horizontally stringing together FCS chains is accomplished using the cascade OR elements G1 and G2. FCS chains may also be implemented by a combination of LUTs within a CLB using the fast interconnect wires placed in the CLB between LUTs.

The method proceeds in two phases. In a first phase, a function F (expressed as an SOP) is decomposed (factored) into chains of factored cube sets (FCS). An FCS is an expression of the original function F having the form F(i)=<shared set>*<unshared set>, where the shared set is a logical AND function (P-term or product term) of any number of variables, and the unshared set is a logical OR function (sum term) of K or fewer logically ANDed variables. See paragraph [0008] above for an example. In a second phase, the FCS chains are implemented with LUTs and dedicated resources.

In the first phase of the method, the function F is factored into FCSs such that the total number of FCSs representing the function F is minimized. The method proceeds by taking each p-term (e.g. p-term P(i)) in the function F and determining which FCS, of all FCSs formed to date, can accommodate p-term P(i) such that the requirements for the FCS (above) remain true. If no current FCS can accommodate p-term P(i), a new FCS is formed with p-term P(i) as a member.

By limiting the number of variables for the unshared set to K, the portions of the unshared set combined with a logical AND may be mapped to a K-LUT. In the following expressions, a logical OR operation is denoted by a "+" symbol, a logical AND operation is denoted by a "*" symbol, and a logical NOT operation is denoted by a "!" symbol. For example, in the SOP expression $F=a*b*c*d*e*p*q*r*s*t+!a*b*c*e*!f*p*q*r*s*t+$
$a*b*c*!d*e*p*q*r*s*t+g*h*i*j*k*p*q*r*s*t+$
$!g*h*i*k*!m*p*q*r*s*t+g*h*i*j*!k*p*q*r*s*t,$ the function can be factored into two FCSs, a first FCS, FCS1 having a shared set of b*c*e*p*q*r*s*t and an unshared set of $$a*d+!a*!f+a*!d$$

and a second FCS, FCS2 having a shared set of $$h*i*p*q*r*s*t$$

and an unshared set of $$g*j*k+!g*k*!m+g*j*!k.$$

Considering a 4-LUT architecture (i.e. K=4), each portion of the unshared set of FCS1 (i.e. each portion coupled with a logical AND) comprises 4 or fewer inputs. Each portion of the unshared set of FCS2 also comprises 4 or fewer inputs. This phase is discussed in more detail below.

In the second phase of the present embodiment, the best-delay softPAL implementation (e.g. a combination of LUTs and architecture specific logic circuits) of the factored function F is computed. In one embodiment, three schemes of implementing the factored function F are computed, and the scheme producing the best-delay is used as the best-delay softPAL implementation. A first scheme configures the carry element as a logical AND, and sums the p-terms together horizontally using the OR gates. A second scheme configures both the carry and horizontal cascade elements as a logical OR. A third scheme implements the function within a single CLB using only LUTs. FCS chains are formed from the function F for each of the implementation schemes in order to provide each implementation scheme with the best possible delay.

SoftPAL Implementation Scheme 1: Carry element configured as a logical AND and p-terms summed together horizontally The first softPAL implementation scheme of the present embodiment, Scheme 1, uses LUTs, carry elements and horizontal cascade elements. Every carry element is configured as a logical AND element. For Scheme 1, FCS chains are formed so that each chain implements a single FCS. The shared set of each FCS chain is decomposed into a series of K-LUTs each performing the AND function of K or fewer input variables. The K-LUTs implementing an FCS chain are then strung together by the carry elements (also performing a logical AND operation) to produce wide AND functions. The unshared set (which has four or fewer variables in the case of a 4-LUT) is also implemented using a K-LUT. The K-LUT implementing the unshared set is coupled with the implementation of the shared set using a carry element (performing a logical AND function).

Figure 3A:
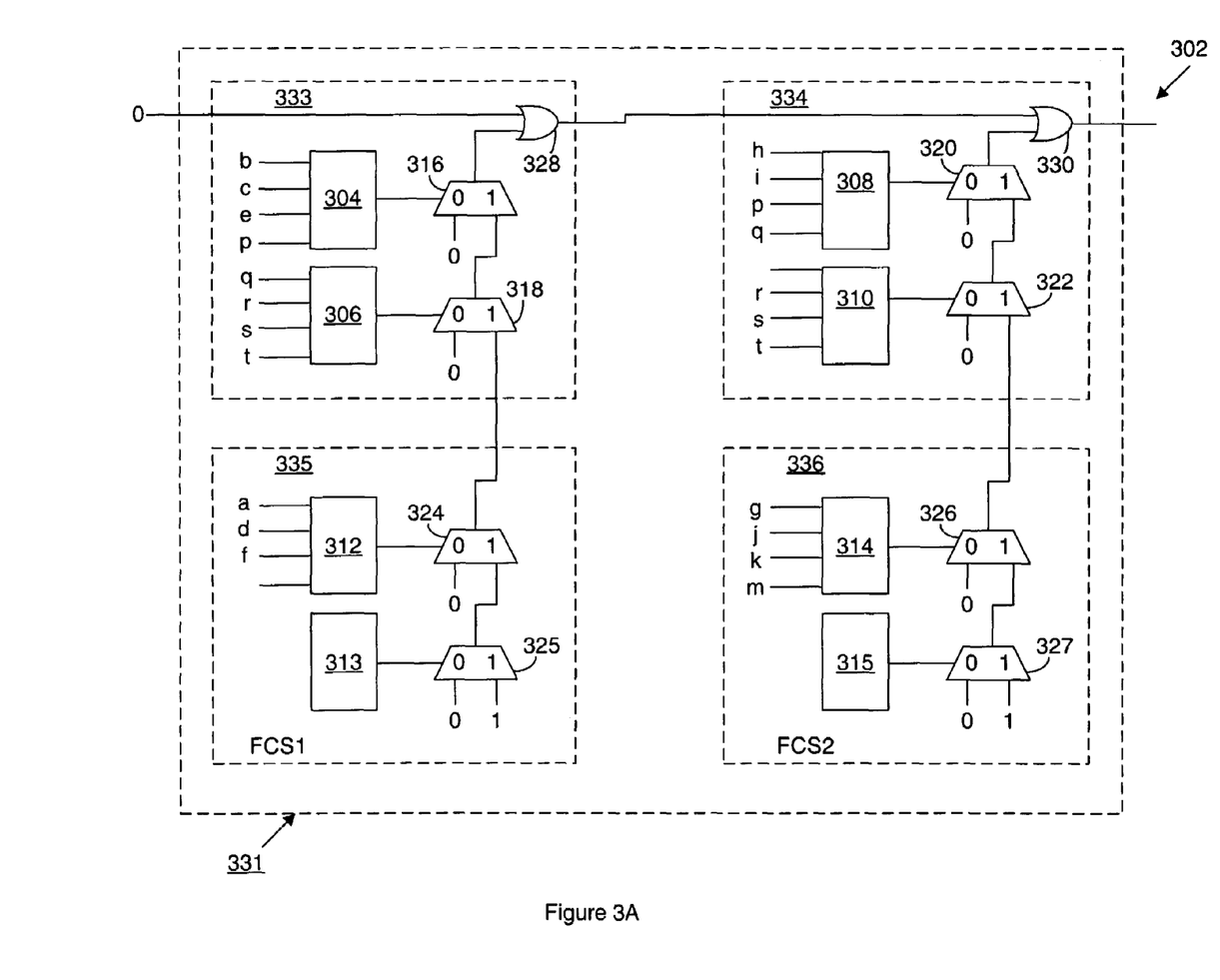
FIG. 3A is a block diagram of an example of softPAL implementation scheme 1, implementing programmable array logic using 4-LUTs, carry elements implementing AND functions, and cascade elements implementing OR functions in the PLD of FIG. 2 in accordance with the present invention.

FIG. 3A is a block diagram of Scheme 1, implementing a softPAL using 4-LUTs and the carry/cascade elements in a Virtex-II™ chip in accordance with the present invention. Implementation 302 includes a CLB 331. CLB 331 is similar to CLB 210 (FIG. 2). Considering the above example $$F=a*b*c*d*e*p*q*r*s*t+!a*b*c*e*!f*p*q*r*s*t+\\a*b*c*!d*e*p*q*r*s*t+g*h*i*j*k*p*q*r*s*t+\\!g*h*i*k*!m*p*q*r*s*t+g*h*i*j*!k*p*q*r*s*t,$$

the function is factored into two cube sets written as $$F=(b*c*e*p)*(q*r*s*t)*(a*d+!a*!f+a*!d)+(h*i*p*q)\\*(r*s*t)*(g*j*k+!g*k*!m+g*j*!k)$$

The first factored cube set is $$FCS1=(b*c*e*p)*(q*r*s*t)*(a*d+!a*!f+a*!d)$$

and the second factored cube set is $$FCS2=(h*i*p*q)*(r*s*t)*(g*j*k+!g*k*!m+g*j*!k).$$

These factored cube sets FCS1 and FCS2 meet the requirement that no unshared set have more than K (in this example, four) input variables.

The first FCS, FCS1, is implemented in two slices 333 and 335 (e.g. slices S1 and S0 in FIG. 2) of the four slices of CLB 331. The first p-term (b*c*e*p) is placed in LUT 304. The second p-term (q*r*s*t) is place in LUT 306. The unshared set (a*d+!a*!f+a*!d) is placed in LUT 312. LUT 313 is not used (or may be configured to output a constant logic 1).

The second FCS, FCS2, is implemented in two slices 334 and 336 (e.g. slices S3 and S2 in FIG. 2). The p-term (h*i*p*q) may be placed into LUT 308; the p-term (r*s*t) may be placed into LUT 310; and the unshared set (g*j*k+!g*k*!m+g*j*!k) may be placed into LUT 314. LUT 315 may be left unused, or programmed to output a constant logic 1. OR gate 328 may be provided a logic 0 on its upper input so that it forwards the output of multiplexer 316 to OR gate 330, which sums FCS1 and FCS2.

Carry elements (i.e. multiplexers 316, 318, 320, 322, 324, 325, 326, and 327) are configured to implement logical AND functions (by applying logic 1 only to a first input terminal of the chain at multiplexers 325 and 327, and logic 0 to all other input terminals in the chain). For example, multiplexer 316 implements the logical AND of the function implemented in LUT 304 and the function implemented in LUT 306.

Minimizing Delay

The arrival times of the input variables are used to determine the relative placements of those input variables among the shared sets, as well as the relative placements of the shared and unshared sets. Thus, the input variables having earlier arrival times are placed such that they can encounter further delay. In the Virtex-II architecture, "OR" gates such as 328 and 330 are available and are used as horizontal cascade elements to sum multiple FCS's together. A pseudocode implementation for this first scheme using K=4 is shown in Table 1.

TABLE 1

```
Scheme_1_Implement {
    For each FCS (FCS(j)) {
        Get arrival times of all variables of shared
            set;
        Generate a sorted shared variables list by
            arranging variables in the shared set in the
            order of the variable arrival times;
        Form a LUT implementation (LUTu) from variables
            of the unshared set;
        Calculate Delay Du = max arrival delay of
            variables of unshared set;
        Form a sorted LUT chain by grouping the sorted
            shared variable list into 4-LUTs;
        Calculate Delay D(i) = max arrival delay of the
            i^th LUT (LUT(i)) in sorted LUT chain;
        Insert LUT LUTu into the sorted LUT chain based
            on the delay Du;
        Place the LUTs in the sorted LUT chain in
            decreasing order of arrival delay D(i) and
            string them together using a vertical carry
            element implementing a logical AND;
        Calculate Delay Df(j) of FCS(j) = max delay (Di)
            of all LUTs in chain;
    }
    Arrange each FCS(j) in order of the associated delay
        Df(j);
    Place each FCS(j) from left to right in order of
        increasing associated delays Df(j);
    Connect the FCSs from left to right using the
        horizontal cascade chain implementing a logical OR
```

TABLE 1-continued

```
        function.
    }
```

The output value of LUT 308 may not be required by multiplexer 320 until the output value of LUT 312 has propagated through the logical AND functions of multiplexers 323, 318, and 316 and OR gate 328. As a result, as an important aspect of the invention, input variables with later arrival time are placed closer to the output location of the function than variables with a earlier arrival time so that the final result can be calculated as quickly as possible. (In FIG. 3A, late arriving signals are placed in a higher vertical position and further right in the drawing.)

SoftPAL Implementation Scheme 2: Carry and cascade elements configured as logical OR The second softPAL implementation scheme of the present embodiment, Scheme 2, implements each FCS using one or more K-LUTs. The total number of LUTs required to implement a FCS must be less than the total number of LUTs in a CLB. If more than the total number of LUTs in the CLB are required to implement the FCS, then Scheme 2 is not used to implement that FCS. This is done so that no extra delays are incurred for inter-CLB routing. However, in architectures where these routing delays are comparable to intra-CLB routing delays, this restriction may be relaxed or modified. For example, each CLB on a Virtex II™ FPGA has eight 4-LUTs. Thus scheme 2 can be used if the FCS requires 8 or fewer 4-LUTs. To form the unshared sets, FCS chains are formed consisting of LUTs strung together by a carry element (e.g. a multiplexer) implementing a logical OR function. Finally, these vertically coupled (strung together) FCS chains may then be horizontally coupled (strung together) using OR gates.

Again considering the above example $$F=a*b*c*d*e*p*q*r*s*t+!a*b*c*e*!f*p*q*r*s*t+\\a*b*c*!d*e*p*q*r*s*t+g*h*i*j*k*p*q*r*s*t+\\!g*h*i*k*!m*p*q*r*s*t+g*h*i*j*!k*p*q*r*s*t,$$

the function is factored into the following cube sets written as $$F=(b*c*e*p)*(q*r*s*t)*(a*d+!a*!f+a*!d)+(h*i*p*q)\\ *(r*s*t)*(g*j*k+!g*k*!m+g*j*!k)$$

The first factored cube set is $$FCS1=(b*c*e*p)*(q*r*s*t)*(a*d+!a*!f+a*!d)$$

and the second factored cube set is $$FCS2=(h*i*p*q)*(r*s*t)*(g*j*k+!g*k*!m+g*j*!k).$$

Since both FCS1 and FCS2 can be implemented in 8 or fewer LUTs, scheme 2 can be used.

A pseudocode implementation for this second scheme using K=4 is shown in Table 2.

TABLE 2

```
Scheme_2_Implement {
    Set List_of_FCS chains = 0;
    For each FCS (FCS(j)) {
        Implement an FCS chain for FCS(j) using a
            combination of 4-LUTs;
        If number of LUTS implementing FCS(j) > Total
            Number of LUTs in a CLB, then return
```

TABLE 2-continued

```
            FAILURE;
        Delay Df(j) = max arrival time of all
            variables to FCS(j) + Delay of a 4-LUT *
            levels of LUTs in FCS(j);
        Call routine Add_FCS_to_Best_Fit_FCSChain;
    }
    Arrange FCS chains in increasing order of
        associated delay FCS_Chain_delay;
    Connect FCS chains using cascade elements
        implementing a logical OR function;
}
Add_FCS_to_Best_Fit_FCSChain {
    Set Best_Delay = 0;
    Sort FCSs in each FCS chain in increasing order of
        each associated delay Df;
    For each FCS chain {
        Temporarily Insert FCS(j) into the sorted FCS
            chain based on the associated delay Df(j);
        Delay DTOT = total delay to implement the FCS
            chains with this FCS(j)
        If (DTOT < Best_Delay) {
            Set Best_Delay_Chain = FCS chain;
            Set Best_Delay = DTOT;
        }
    }
    Permanently Insert FCS in Best_Delay_Chain;
    Delay of FCS chain FCS_Chain_delay = Best_Delay;
}
```

Figure 3B:
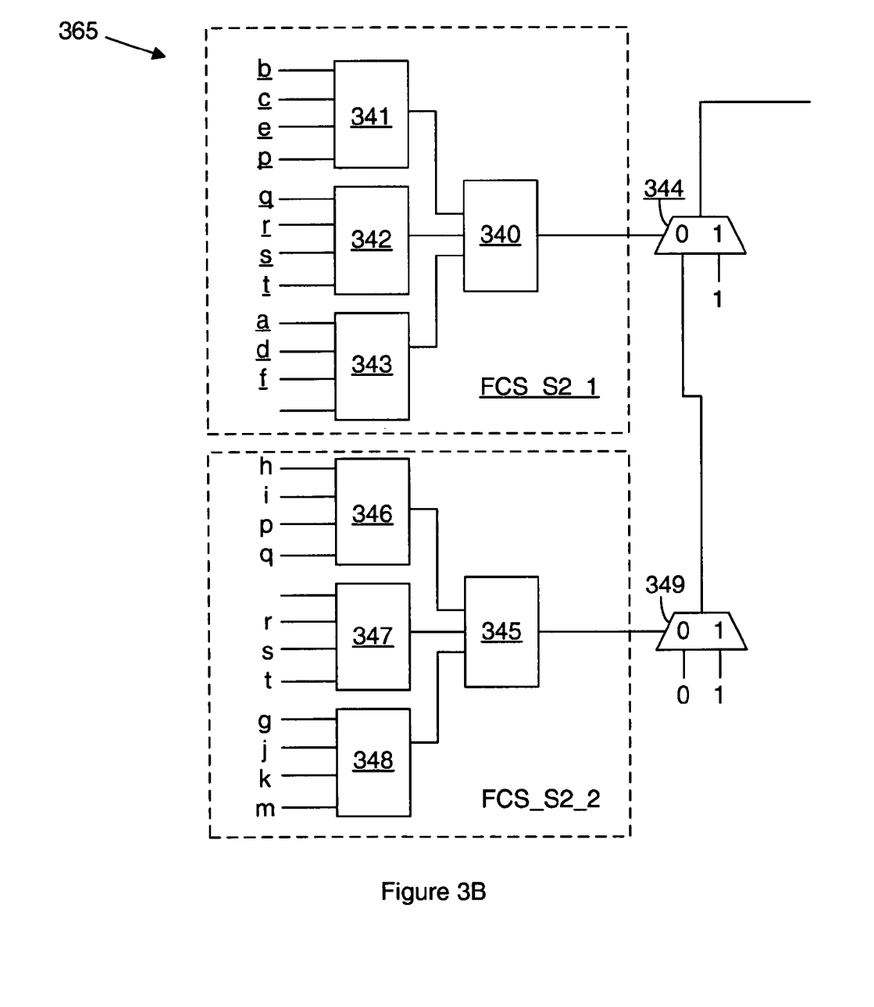
FIG. 3B is an example of scheme 2, implemented using one or more 4-LUTs and carry and cascade elements in a PLD in accordance with the present invention.

FIG. 3B is a block diagram of softPAL implementation scheme 2 implemented using one or more 4-LUTs in a PLD in accordance with the present invention. Implementation 365 includes two factored cube sets, FCS_S2_1 and FCS_S2_2. Factored cube set FCS_S2_1 is implemented using four LUTs 340, 341, 342, and 343. Factored cube set FCS_S2_2 is also implemented using four LUTs, LUTs 345, 346, 347, and 348. An output terminal of LUT 340 controls multiplexer 344 and an output terminal of LUT 345 controls multiplexer 349. The PLD is configured so that LUT 341 computes the function (b*c*e*p); LUT 342 computes (q*r*s*t); and LUT 343 computes (a*d+!a*!f+a*!d). LUT 340 computes the AND function of its three inputs. Similarly, the PLD is configured so that LUT 346 computes (h*i*p*q); LUT 347 computes (r*s*t); and LUT 348 computes (g*j*k+!g*k*!m+g*j*!k). Finally, LUT 345 computes the AND function of its three inputs.

The outputs of LUTs 340 and 345 control, respectively, multiplexers 344 and 349. Multiplexer 349 receives constant 0 and 1 input signals to start the carry chain, and multiplexer 344 is configured as an OR gate by providing a constant logic 1 to be selected when LUT 340 outputs a logic 1, and providing the output of multiplexer 349 to be selected when LUT 340 outputs a logic 0.

SoftPAL Implementation Scheme 3: Implement within a single CLB

A third softPAL implementation scheme of the present invention, Scheme 3, implements each FCS using only 4-LUTs within a single CLB. If the total number of K-LUTs required to implement the FCS is less than or equal to the total number of LUTs in the CLB, then the LUTs in that CLB are used to implement the FCS. If more LUTs are required to implement the FCS than are available in a CLB, then Scheme 3 is not used to implement that FCS. CLB fast-connect routes are used to interconnect these LUTs. CLB fast-connect routes have negligible delays when compared to general-purpose routing delays.

Again considering scheme 3 for implementing the above example $$F=a*b*c*d*e*p*q*r*s*t+!a*b*c*e*!f*p*q*r*s*t+$$
$$a*b*c*!d*e*p*q*r*s*t+g*h*i*j*k*p*q*r*s*t+$$
$$!g*h*i*k*!m*p*q*r*s*t+g*h*i*j*!k*p*q*r*s*t,$$

the function is factored into the following cube sets written as $$F=(b*c*e*p)*(q*r*s*t)*(a*d+!a*!f+a*!d)+(h*i*p*q)$$
$$*(r*s*t)*(g*j*k+!g*k*!m+g*j*!k)$$

The first factored cube set is $$FCS1=(b*c*e*p)*(q*r*s*t)*(a*d+!a*!f+a*!d)$$

and the second factored cube set is $$FCS2=(h*i*p*q)*(r*s*t)*(g*j*k+!g*k*!m+g*j*!k).$$

Since both FCS1 and FCS2 can be implemented in 8 or fewer LUTs, scheme 3 can be used.

A pseudocode implementation for this second scheme using K=4 is shown in Table 3.

TABLE 3

```
Scheme_3_Implement {
    Order FCSs in decreasing order of number of inputs to
FCS
    For each FCS(j) in Ordered FCS list {
        Form Function Fj    = (Fj-1 OR FCS(j)) for j > 0
                            = FCS(0) for j = 0
        Map Fj to a network of 4-LUTs
        If number of LUTs > 4 {
            Return FAILURE;
        }
    }
}
```

Figure 3C:
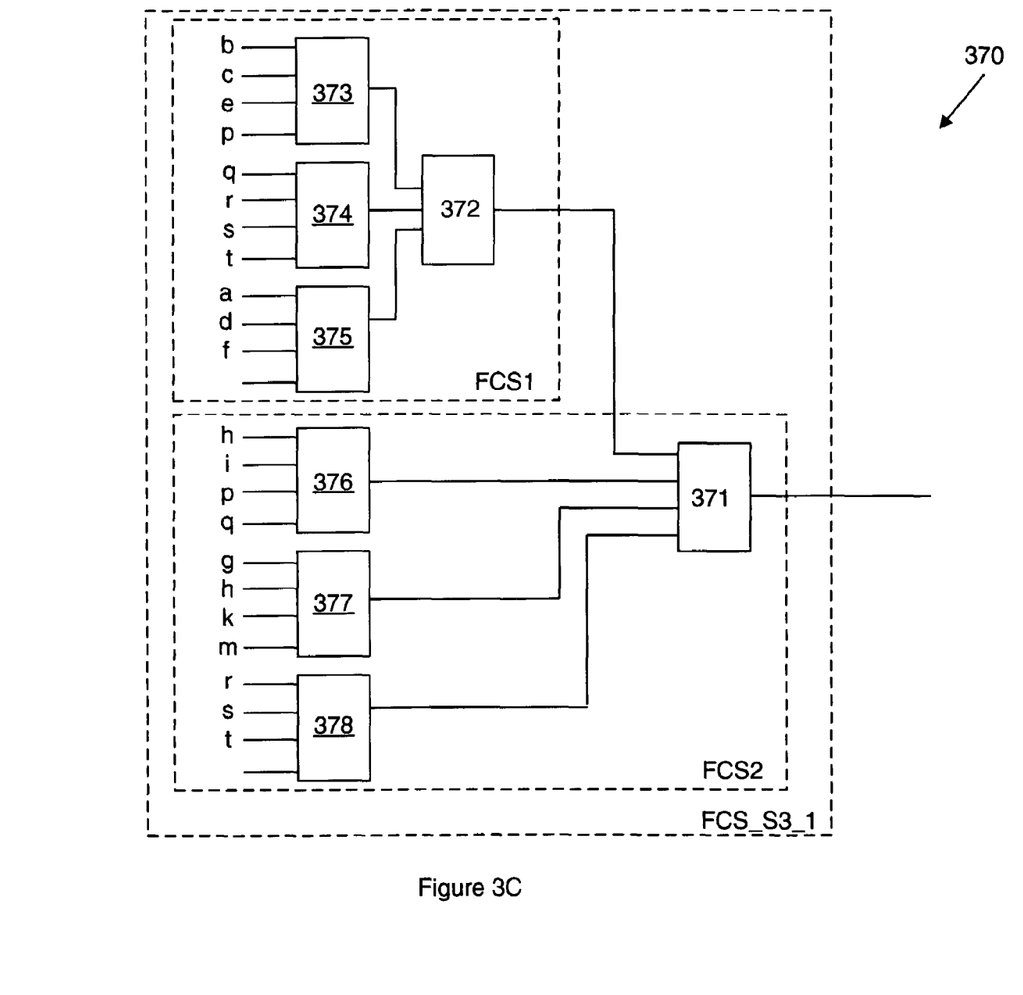
FIG. 3C is an example of scheme 3, implemented using only LUTs in one CLB of a PLD in accordance with another embodiment of the present invention.

FIG. 3C is a block diagram of an embodiment of the third softPAL implementation scheme, Scheme 3, implemented using only 4-LUTs in a CLB (e.g. a CLB on a Virtex II™ FPGA) in accordance with the present invention. Implementation 370 implements a function having two FCSs: FCS1 and FCS2. Both FCSs may be implemented within one CLB. FCS1 is implemented in four LUTs 372–375 as shown in FIG. 3C. LUTs 373 and 374 are configured to perform AND functions of their input variables, and LUT 375 is configured to compute (a*d+!a*!f+a*!d). LUT 372 is configured to compute the AND function of its three input signals. FCS2 is implemented in LUTs 376–378. LUTs 376 and 378 perform AND functions of their input signals, and LUT 377 performs the function (g*j*k+!g*k*!m+g*j*!k). LUT 371 is configured to both complete the second factored cube set FCS2 and to perform the sum of the two factored cube sets FCS1 and FCS2. This is a four-input function, and can thus be implemented by a single LUT. Connection between LUTs in CLBs (shown as lines in FIG. 3C) are made with dedicated fast connects.

The three implementation schemes described above may each be used to cover nodes in a sub-graph of a function F. To select between the three, the nodes in the sub-graph are implemented using all three schemes and the scheme resulting in the lowest delay is chosen as the label for that node.

During labeling (attaching a delay to a node) and the post-labeling optimization portion of the first phase of mapping, a 2-bounded sub-graph of the function F is mapped into a LUT or a combination of a LUT and other resources. A node may be labeled once all of the predecessor nodes have been labeled. A label requires an identification of the node with a particular implementation location. A predecessor node is a node located lower in the node hierarchy.

Cost Tables, Replacing Estimated Delay with Actual Delay, and Critical Paths

In an embodiment of the present invention, a cost table is generated including delay information for each element in the target architecture available for mapping (e.g. LUTs and cascade elements) using estimated delays for the softPAL elements having unknown delays. During the mapping portion, the delays of the estimated softPALs in the cost table are assigned based on the actual implemented delays. Thus, during the labeling portion, if the node is determined to be implemented in a softPAL having an estimated delay, then the actual delay of that softPAL is determined and replaces the estimated softPAL delay in the cost table. Once every node is assigned an actual delay, the critical paths in the labeled design are computed. The nodes along each critical path are then re-labeled utilizing larger LUTs or softPALs (if available). This re-labeling of the nodes along each critical path is repeated until delay in the critical path does not improve.

Each node in topological (from input to output) order is examined to determine whether an existing softPAL implementation in the cost table satisfies a limitation on cumulative delay. Table 4 gives pseudocode for computing actual delay of a softPAL at a node.

TABLE 4

```
Compute_Actual_Delay_At_Node {
    Dc = Calculated delay at Node
    Collapse node into SOP form
    Factorize node into FCS sets
    Implement node in 3 softPAL implementation schemes
    Da = Min Delay (Scheme1, Scheme2, Scheme3)
    Set Delay of Node to Da
}
```

If the cumulative delay for any softPAL implementation is greater than an implementation of the node using 4-LUTs, then nothing has been gained by avoiding an additional level of 4-LUTs. Therefore, the additional level of 4-LUTs is assigned to the node. This process is described by Mohan and Chaudhary in U.S. Pat. No. 6,336,208 B1, entitled "Delay Optimized Mapping For Programmable Gate Arrays With Multiple Sized Lookup Tables", which is incorporated by reference herein.

If the node is determined to be implementable in a softPAL implementation, a delay correction is performed to replace the estimated delay obtained from the cost table with the actual delay of the softPAL as implemented on the PLD. In performing the actual delay calculation, the 2-bounded sub-tree is collapsed back to the SOP form. The SOP form is translated into the FCS form as described above, and each of the schemes (in the above discussion, Scheme 1, Scheme 2, and Scheme 3) is utilized to generate an associated delay. As described above, the scheme having the best delay is used to implement the FCS. The node is then reassigned this new delay value in the cost table. As described, the node has been covered with the first (lowest delay) softPAL implementation in the cost table that meets the criteria. However, another element located lower in the cost table may provide a smaller actual delay. As a result, nodes along the critical paths are re-implemented using alternative elements from the cost table, and the implementation having the least delay is utilized.

A pseudocode implementation for this delay optimization method is shown in Table 5.

TABLE 5

```
Repeat until critical delay cannot be further reduced {
    Get all critical path nodes in the design;
    Define node_delay(j) for each critical path
        node(j);
    For each critical path node(j) {
        For i = (a tolerance bound (−delta)) to (the
            delay of a LUT delay − 1) {
            For each element (m) (function
                implementable in a LUT plus other
                resources) in the cost table {
                Compute the new delay new_delay of
                    the critical path node(j) with
                    element (m);
                If (new_delay < node_delay(j)) {
                    Set node_delay(j) = new_delay;
                    Define the node type (e.g.
                    PAL/LUT);
                }
            }
        }
    }
}
```

As described above, a 2-bounded sub-graph of the design is mapped into a LUT or LUT plus other resources by collapsing the sub-graph into an SOP form. The total number of p-terms in the SOP form should be less than the number of p-terms available in the softPAL implementation specified in the cost table. Collapsing a complex sub-graph into SOP form is computationally intensive. Therefore, a p-term estimation function that estimates the number of p-terms without distributing the function into the SOP form is described.

Figure 4A:
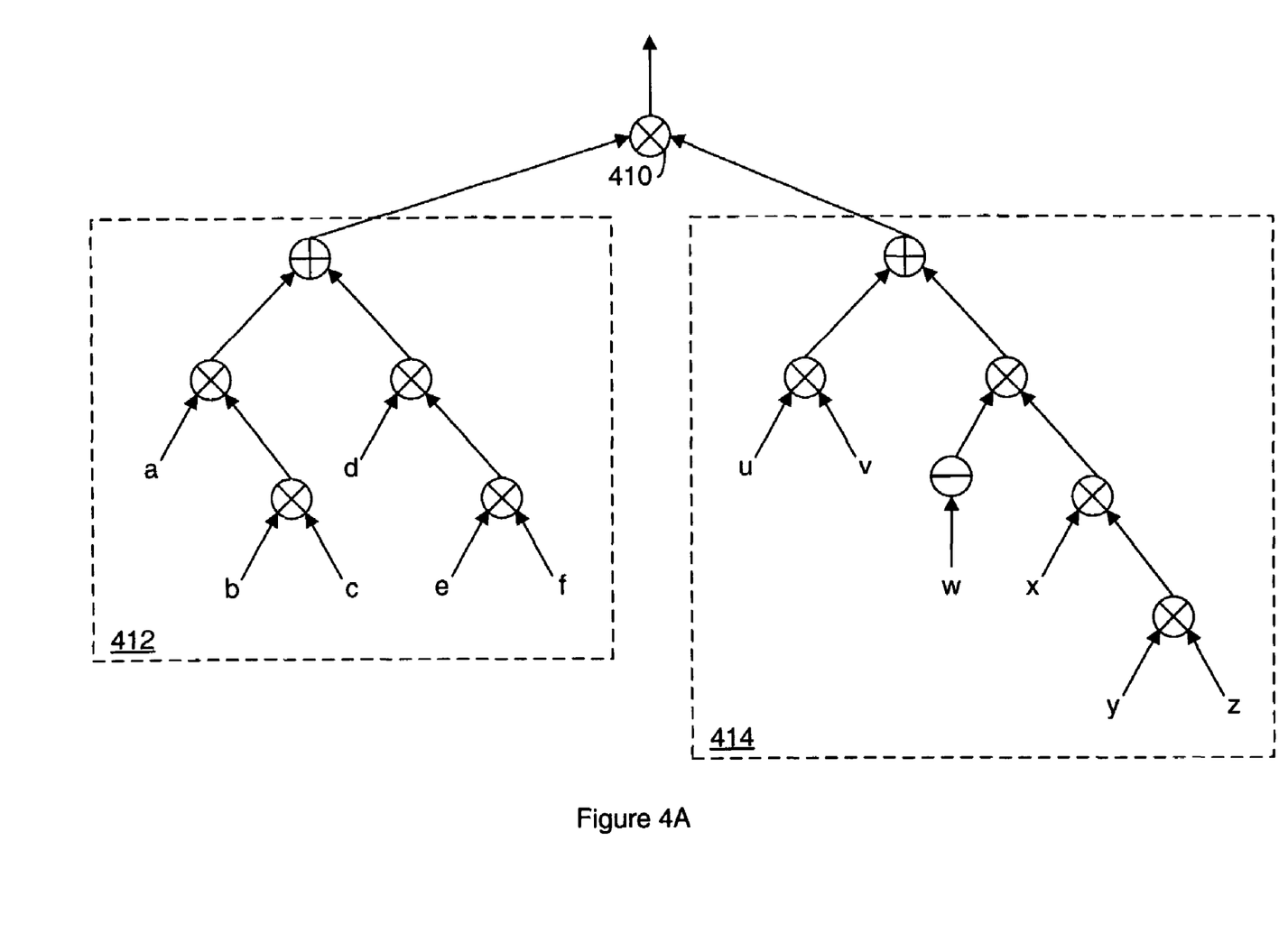
FIG. 4A is a function tree diagram for a node performing a logical AND function.
Figure 4B:
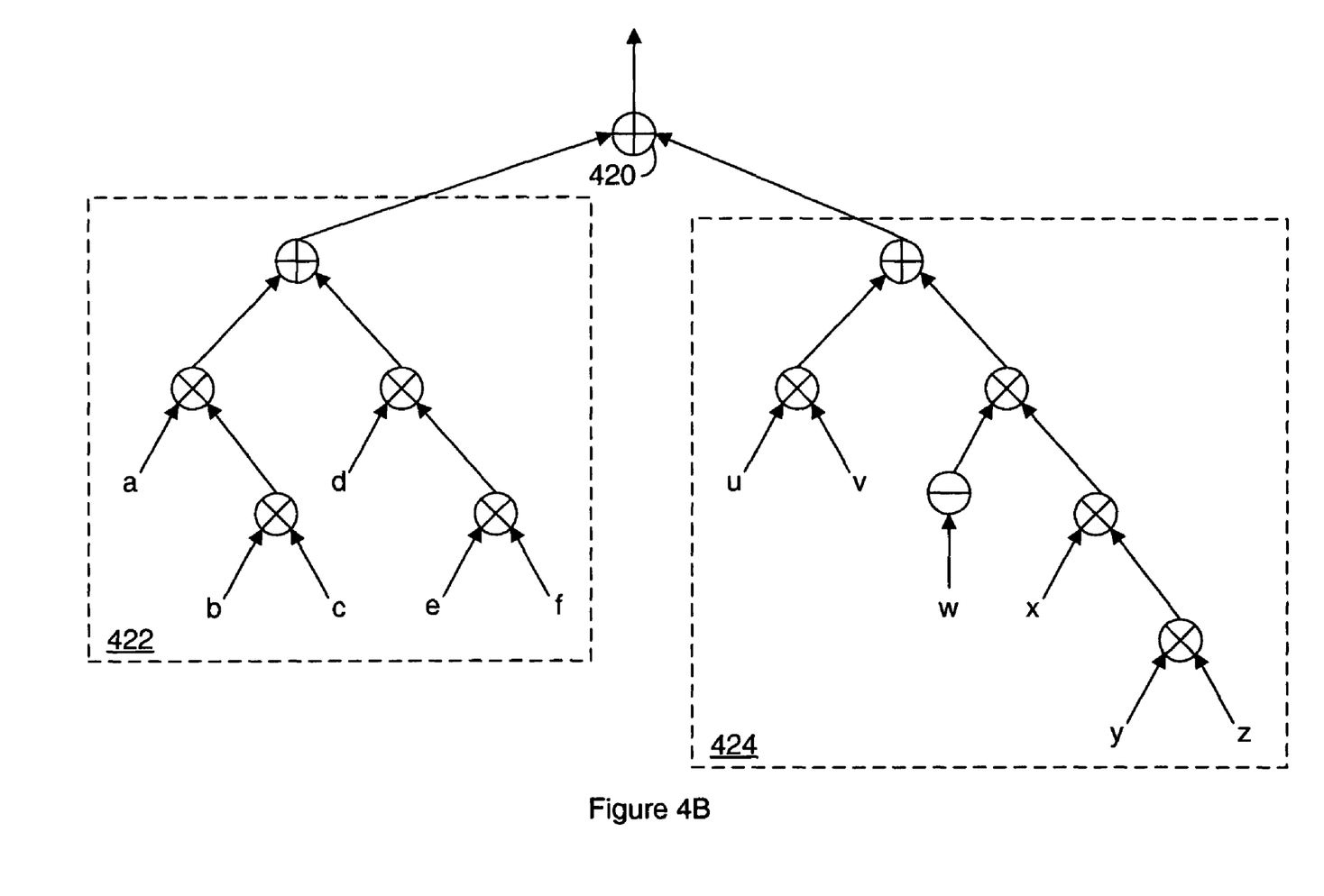
FIG. 4B is a function tree diagram for a node performing a logical OR function.
Figure 4C:
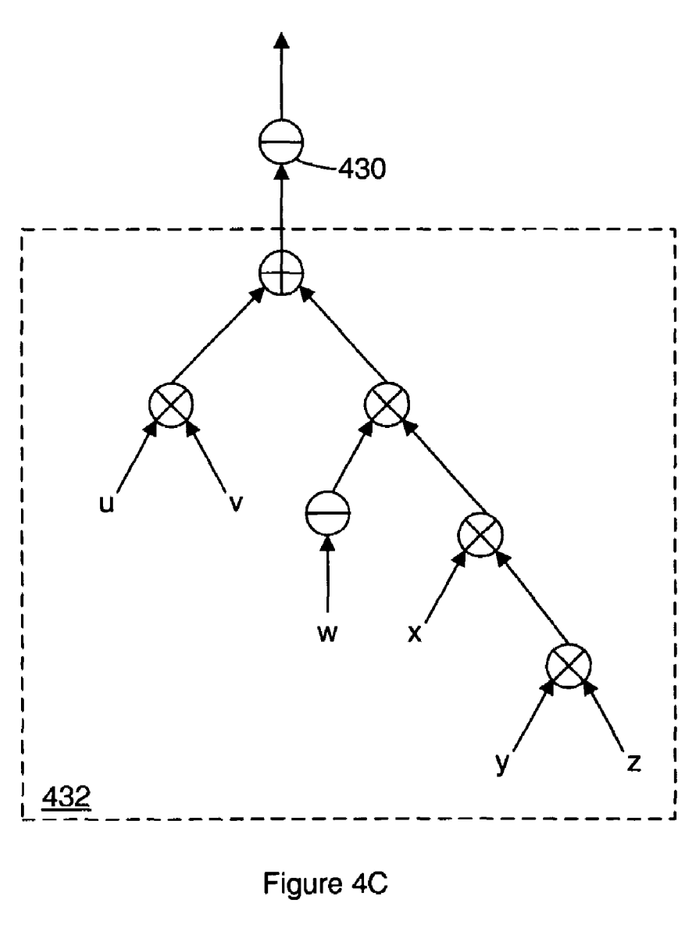
FIG. 4C is a function tree diagram for a node performing a logical NOT function.

FIGS. 4A–4C illustrate examples of a process for estimating the number of p-terms at a node without distributing the function. This process is also used to determine whether the node can be implemented as a softPAL. The p-term estimating function works in recursive fashion. FIGS. 4A–4C explain the p-term estimation technique that may be used to determine if a node can actually be implemented as a softPAL. A node can actually be implemented if the number of inputs and number of p-terms are less than what is specified by one of the elements in the cost table. But to calculate the p-terms at every node is computationally intensive. So, the method of the invention makes use of other alternative algorithms to estimate the number of p-terms. Following is an algorithm that can be used to estimate the number of p-terms.

Specifically, to calculate the number of p-terms at any node in the sub-graph, the number of p-terms of all the predecessor nodes must have already been calculated. Thus, the predecessor nodes are calculated first. At each node in the sub-graph, an associated array A is maintained including the number of p-terms at that node as well as the number of inputs associated with each p-term. For example, if the equation at a node is "F=a*b+c*d*e+f", then the associated array for the node is A=(2, 3, 1). The size of the array (e.g. 3) indicates the total number of p-terms at the node, and the array value (e.g. 2, 3, and 1) indicates the number of variables of each p-term of the SOP function at the node.

A node performing a wide logical AND function is decomposed into smaller nodes having no more than two inputs (variables), a left SOP (called a left child) and right SOP (called a right child). The left child has a node array $A_L=(L[1], L[2], \ldots L[n])$ and the right child has a node array $A_R=(R[1], R[2], \ldots R[m])$. The node array $A_{NA}$ of the current node is of size (m*n). A pseudocode implementation to obtain each element of the array is shown in Table 6:

TABLE 6

```
For (p = 1 to n) {
    For (q = 1 to m) {
        A_NA[(p−1)*m +q] = L[p] + R[q];
    }
}
``` where p and q are integer indices, n represents the number of nodes, and m represents the number of p-terms.

FIG. 4A is a function tree diagram for a node 410 performing a logical AND function. The AND function of node 410 is denoted by an "X" within a circle. The left child 412 implements the SOP equation "F=a*b*c+d*e*f", wherein a three-variable p-term (a*b*c) is logically OR'ed with another three-variable p-term (d*e*f). Thus, the left child 412 has two p-terms (n=2) consisting of three elements each, for a node array $A_L=(3,3)$. The right child 414 implements the SOP equation "u*v+!w*x*y*z", wherein a two variable p-term (u*v) is logically OR'ed with a four variable p-term (!w*x*y*z). Thus, the right child 414 has two p-terms (m=2), one having two elements and one having four elements, for a node array $A_R=(2,4)$. The node array $A_{NA}$ for node 410 has a size of n*m=2*2=4. Applying the pseudocode of Table 5 results in a node array $A_{NA}$ for node 410 of $A_{NA}=(5,7,5,7)$.

A node performing a logical OR function also has two inputs, a left SOP (called a left child) and right SOP (called a right child). The left child has an array $A_L=(L[1], L[2], \ldots L[n])$ and the right child has an array $A_R=(R[1], R[2], \ldots R[m])$. The current node array $A_{NO}$ is of size (m+n). A pseudocode implementation to obtain each element of the array is shown in Table 7:

TABLE 7

```
For (p = 1 to n) {
    A_NO[p] = L[p];
}
For (q = 1 to m) {
    A_NO[n+q] = R[q];
}
```

FIG. 4B is a function tree diagram for a node 420 performing a logical OR function. The logical OR function of node 420 is denoted by an "+" within a circle. Similar to left child 412 (FIG. 4A), the left child 422 has two p-terms (n=2) of three elements each, for a node array $A_L=(3,3)$. Similar to right child 414 (FIG. 4A), the right child 424 has two p-terms (m=2), one having two elements and one having four elements, for a node array $A_R=(2,4)$. The node array $A_{NO}$ for node 420 has a size of 2+2=4. Applying the pseudocode of Table 6 results in a node array $A_{NO}$ for node 420 of $A_{NO}=(3,3,2,4)$.

A node performing a logical NOT function has one input, and therefore has a single SOP child. The child has a node array $A_L=(L[1], L[2], \ldots L[n])$. Each element of the current node array $A_{NN}$ has a value of n. A pseudocode implementation to obtain the size of the node array $A_{NN}$ is shown in Table 8:

TABLE 8

```
Size = 1;
For (p = 1 to n) {
    Size = Size * L[p];
}
```

FIG. 4C is a function tree diagram for a node 430 performing a logical NOT function. The logical NOT function of node 430 is denoted by a "−" within a circle. The child 432 has two p-terms (n), one with two elements and one with four elements, for a node array $A_L=(2,4)$. Applying the pseudocode of Table 7 results in a node array size of 2*4=8. Thus, each element in the node array $A_{NN}$ has a value of n=2, for an array $A_{NN}$ for node 430 of (2,2,2,2,2,2,2,2).

Utilizing the above-described methods of the p-term estimating function yields an exact solution when no inputs are repeated in either the left or the right child. However, this is not always the case. The p-term estimating function over-estimates the number of p-terms at the node when an overlap of inputs exists between the left and right children of the node.

In the various embodiments of this invention, novel structures and methods have been described to label and map softPAL functions to LUTs and other resources as well as to format the functions for analysis prior to labeling and mapping. The various embodiments of the methods of this invention that are described above are illustrative only of the principles of this invention and are not intended to limit the scope of the invention to the particular embodiments described. For example, in view of this disclosure, those skilled in the art can define other elements of this or other target architectures that may be utilized to function similarly to the softPAL embodiments described, and use these alternative features to create a method or system according to the principles of this invention. Thus, the invention is limited only by the following claims.

What is claimed is:

1. A method for mapping a function to logic in a programmable logic device having at least one look up table (LUT) and at least one dedicated logic element, the method comprising:
   factoring the function to derive a factored form of the function;
   placing input variables of the function having later arrival times closer to the output location of the function than input variables having earlier arrival times;
   implementing the factored form of the function according to a plurality of configurations of logic using the at least one LUT and the at least one dedicated logic element; and
   selecting a configuration of the plurality of configurations implementing the factored form of the function having the least delay.

2. The method of claim 1, wherein implementing the factored form of the function according to a plurality of configurations using the at least one LUT and the at least one dedicated logic element comprises:
   implementing a first portion of the factored form of the function using the LUT; and
   implementing a second portion of the factored form of the function using the dedicated logic element.

3. The method of claim 1, wherein factoring the function to derive a factored form of the function comprises forming a plurality of factored cube sets for the function, wherein each factored cube set comprises a shared set and an unshared set.

4. The method of claim 3, wherein the function comprises a plurality of p-terms, and forming a plurality of factored cube sets comprises:
   forming a first factored cube set to accommodate a first p-term; and
   forming a second factored cube set to accommodate a second p-term when the first factored cube set cannot accommodate the second p-term.

5. The method of claim 4, further comprising:
   forming a third factored cube set to accommodate a third p-term when the first factored cube set and the second factored cube set cannot accommodate the third p-term.

6. The method of claim 3, wherein implementing the factored form of the function according to a plurality of configurations using the at least one LUT and the at least one dedicated logic element, comprises:
   using a first LUT to perform a first function on a first portion of the shared set of a first factored cube set;
   using a second LUT to perform a second function on a portion of the unshared set of the first factored cube set; and
   forming a first LUT chain by coupling the first LUT and the second LUT using a first dedicated logic element of the programmable logic device.

7. The method of claim 6, further comprising:
   using a third LUT to perform a third function on a second portion of the shared set of the first factored cube set; and
   expanding the first LUT chain by coupling the third LUT to the first LUT chain using a second dedicated logic element of the programmable logic device.

8. The method of claim 7, further comprising sorting variables of the shared set based on arrival time.

9. The method of claim 7, further comprising calculating a maximum variable arrival time for each LUT.

10. The method of claim 9, wherein the first LUT chain is arranged based on the maximum variable arrival time of each LUT.

11. The method of claim 6, further comprising:
    using a third LUT to perform a third function on a second portion of the unshared set of the first factored cube set; and
    expanding the first LUT chain by coupling the third LUT to the first LUT chain using a second dedicated logic element of the programmable logic device.

12. The method of claim 6, wherein the first dedicated logic element includes a carry element.

13. The method of claim 6, further comprising:
    forming a second LUT chain for a second factored cube set; and
    coupling the second LUT chain to the first LUT chain with a second dedicated logic element of the programmable logic device.

14. The method of claim 13, wherein the second dedicated logic element is a cascade element that implements the OR function.

15. The method of claim 13, further comprising:
    calculating an associated delay for each LUT chain; and
    arranging the LUT chains based on the associated delays.

16. The method of claim 3, wherein implementing the factored form of the function using a dedicated logic element, comprises:
    using a first combination of look up tables (LUTs) to implement a first factored cube set;

using a second combination of LUTs to implement a second factored cube set; and forming a first look up table (LUT) chain by coupling the first combination of LUTs and the second combination of LUTs using a first dedicated logic element of the programmable logic device.

17. The method of claim 16, wherein the first dedicated logic element is a carry element.

18. The method of claim 17, wherein the carry element is a multiplexer configured to implement a logical OR function.

19. The method of claim 17, wherein the carry element is a multiplexer configured to implement a logical AND function.

20. The method of claim 16, further comprising:

using a third combination of LUTs to implement a third factored cube set; and expanding the first LUT chain by coupling the third combination of LUTs to the first LUT chain using a second dedicated logic element of the programmable logic device.

21. The method of claim 16, further comprising calculating a LUT combination delay for each combination of LUTs.

22. A programmable logic device configured to implement a function in factored form having a plurality of factored cube sets, wherein each factored cube set comprises a shared set and an unshared set, the programmable logic device comprising:

a first look up table (LUT) configured to implement a first portion of the shared set of a first factored cube set;

a second LUT coupled to implement a portion of the unshared set of the first factored cube set; and a first dedicated logic element coupling the first LUT and the second LUT to form a first LUT chain having a selected configuration of a plurality of configurations of the first and second LUTs and the first dedicated logic element, the selected configuration having the least delay of the plurality of configurations when configured in the programmable logic device, wherein input variables of the function having later arrival times are placed closer to the output location of the function than input variables having earlier arrival times.

23. The programmable logic device of claim 22, further comprising:

a third LUT configured to implement a second portion of the shared set of the first factored cube set; and a second dedicated logic element coupling the third LUT to the first LUT chain.

24. A programmable logic device, configured to implement a function in factored form having a plurality of factored cube sets, wherein each factored cube set comprises a shared set and an unshared set, the programmable logic device comprising:

a first combination of look up tables (LUTs) configured to implement a first factored cube set;

a second combination of LUTs configured to implement a second factored cube set; and a first dedicated logic element coupling the first combination of LUTs and the second combination of LUTs to form a first chain of combinatorial look up table (LUT) elements, the first chain of combinatorial LUT elements being selected from a plurality of configurations of chains of combinatorial LUT elements and dedicated logic elements implementing the function and having the least delay of the plurality of configurations of chains, wherein input variables of the function having later arrival times are placed closer to the output location of the function than input variables having earlier arrival times.

25. A method of mapping a softPAL into a programmable logic device (PLD), wherein a softPAL is a function that, when written in a sum-of-products (SOP) form, is too wide to be implemented in a single lookup table (LUT) but may be implemented using a combination of lookup tables (LUTs) and dedicated logic elements, the method comprising:

expressing the softPAL as a sum-of-products (SOP) function;

factoring the SOP function into at least one chain of factored cube sets (FCSs) having the form $$F(i)=<\text{shared set}>*<\text{unshared set}>,$$

where the shared set is a logical AND function of any number of variables, and the unshared set is a logical OR function of K or fewer logically ANDed variables, where K is a number of inputs to a lookup table (LUT) in the PLD;

determining a configuration of LUTs and dedicated logic elements, of a plurality of configurations of LUTs and dedicated logic elements, having the least delay for the at least one chain of FCSs;

implementing the at least one chain of FCSs with the combination of LUTs and dedicated resources having the least delay, wherein input variables of the function having later arrival times are placed closer to the output location of the function than input variables having earlier arrival times.

26. The method of claim 25 further comprising:

adding product terms to the unshared set to be implemented by a LUT until K is reached, then forming another FCS if additional product terms remain.

27. The method of claim 25 wherein three schemes are considered for the step of implementing the at least one chain of FCSs with a combination of LUTs and dedicated resources.

28. The method of claim 25 wherein the step of implementing implements at least one portion of the shared set in a carry chain of the PLD.

29. The method of claim 25 wherein the step of implementing implements at least one portion of the unshared set using cascade OR gates of the PLD.

30. The method of claim 25 wherein the step of implementing implements at least a portion of the unshared set in a carry chain of the PLD.

31. The method of claim 25 wherein the step of implementing comprises:

calculating maximum arrival delay of variables in the unshared set;

forming a LUT implementation from the variables in the unshared set; and combining the LUTs implementing the shared and the unshared sets.

32. The method of claim 25 wherein the step of implementing comprises:

generating a sorted shared variable list by arranging the shared variables in order of arrival times of the shared variables; and forming a sorted LUT chain by grouping the sorted shared variables into LUTs with earliest arriving variables closest to a beginning of the LUT chain.

33. The method of claim 25 wherein the step of implementing comprises:
for each FCS,
implementing an FCS chain within a single CLB; and
calculating delay of the FCS chain;
arranging the FCS chains in increasing order of delay of the FCS chain; and
connecting the FCS chains using cascade elements implementing a logical OR function.

34. The method of claim 33 wherein the step of implementing further comprises:
sorting FCSs in each FCS chain in increasing order of delay of the FCSs in the FCS chain.

35. A method for mapping a function to logic elements in a programmable logic device comprising:
factoring the function to derive a factored form of the function;
determining arrival time for input signals to each factor in the factored form;
implementing the factored form of the function such that each factor is implemented by one of a plurality of lookup tables, and factors having signals with the latest arrival times are implemented by lookup tables closest to an output location of the function;
implementing the factored form of the function according to a plurality of configurations using the plurality of lookup tables and at least one dedicated logic element; and
selecting a configuration of the plurality of configurations with the least delay.

36. The method of claim 35, wherein a determination of which logic elements are closest to an output location is determined by using a cost table specifying delay for each softPAL that implements a factor.

37. The method of claim 36, wherein the cost table includes softPALs listed in order of increasing delay.

38. The method of claim 36, wherein each softPAL that implements a factor is selected from a plurality of possible softPALs that can implement the factor.

39. The method of claim 36, wherein each softPAL is selected from the plurality of possible softPALs based on minimizing delay.

40. A post-mapping optimizing method comprising:
(a) forming a mapped design mapped to a combination of look up tables (LUTs) and original sized softPALs, wherein a softPAL is a function that, when written in a sum-of-products (SOP) form, is too wide to be implemented in a single lookup) table (LUT) but may be implemented using a combination of lookup tables (LUTs) and dedicated logic elements;
(b) calculating original critical path delay in the mapped design;
(c) for each critical path in the mapped design:
re-mapping the critical path node to a larger sized softPAL;
if delay is reduced, accepting the large sized softPAL;
if delay is not reduced, retaining the look up table (LUT) or original sized softPAL;
(d) re-calculating a new critical path delay for a new mapped design;
(e) if the new critical path delay for the mapped design is less than the original critical path delay, accepting the new mapped design; and
(f) repeating steps (a) through (e) until the new critical path delay for the mapped design is not less than the original critical path delay.

41. A method for determining a delay of a node for implementing a softPAL using a combination of look up tables (LUTs) and dedicated logic elements, wherein a softPAL is a function that when written in a sum-of-products (SOP) form is too wide to be implemented in a single LUT but may be implemented using a combination of LUTs and dedicated logic elements, the method comprising:
forming a first set of one or more factored cube set (FCS) chains representing the equation;
implementing the first set of FCS chains with a first implementation scheme;
assigning a delay to the node of the first implementation scheme;
forming a second set of one or more FCS chains representing the equation;
implementing the second set of FCS chains with a second implementation scheme; and
updating the delay of the node when a delay of the second implementation scheme is less than the delay of the node.

42. A method for decreasing delay of a node in a critical path during a mapping of a function, comprising:
providing a cost table, in decreasing order, of estimated delays associated with a plurality of elements for mapping the function;
implementing the function in programmable logic of a programmable logic device using a first element in the cost table;
obtaining a first delay for the node based on the first element in a cost table;
assigning the first delay to a delay of the node;
selecting a second element in the cost table to map the function, the second element in the cost table comprising a different number of inputs than the first element in the cost table;
implementing the function in programmable logic of a programmable logic device using the second element in the cost table;
obtaining a second delay for the node based on the second element in the cost table; and
assigning the second delay to the delay of the node when the second delay is smaller than the first delay.

43. A method of mapping a function to a combination of one or more LUTs and dedicated logic elements, the method comprising:
forming factored cube sets (FCSs) from the function;
configuring, according to a plurality of configurations, a set of one or more vertical elements to perform a logical function;
mapping, for each configuration of the plurality of configurations, the FCSs to a series of one or more LUTs performing logical functions;
selecting a configuration of the plurality of configurations having the least delay;
coupling the one or more LUTs with the one or more vertical elements according to the selected configuration, wherein input variables having later arrival times are placed closer to the output location of the function than variables having earlier arrival times.

* * * * *